United States Patent [19]

Yamaguchi

[11] Patent Number: 4,760,357
[45] Date of Patent: Jul. 26, 1988

[54] NOISE FILTER WITH INLET SOCKET

[75] Inventor: Kouichi Yamaguchi, Nagaokakyo, Japan

[73] Assignee: Murata Manufacturing Co., Ltd., Japan

[21] Appl. No.: 919,049

[22] Filed: Oct. 15, 1986

[30] Foreign Application Priority Data

Oct. 16, 1985 [JP] Japan .............................. 60-158293[U]
Oct. 16, 1985 [JP] Japan .............................. 60-158294[U]

[51] Int. Cl.⁴ ................................................ H03H 7/00
[52] U.S. Cl. ..................................... 333/181; 333/185; 361/399; 361/401; 439/620
[58] Field of Search .................. 333/12, 167, 181, 185; 361/399, 401; 339/14 R, 14 P, 143 R, 147 R; 439/607, 610, 620

[56] References Cited

U.S. PATENT DOCUMENTS

| | | | |
|---|---|---|---|
| 2,939,095 | 5/1960 | Chertok | 333/167 |
| 3,374,447 | 3/1968 | Stilwell | 333/167 |
| 3,636,481 | 1/1972 | Boulin et al. | 333/185 |
| 3,737,729 | 6/1973 | Carney | 361/399 X |
| 3,870,392 | 3/1975 | Bond | 333/14 R |
| 4,408,171 | 10/1983 | Akino et al. | 333/185 X |
| 4,409,641 | 10/1983 | Jakob et al. | 361/399 X |
| 4,455,538 | 6/1984 | Kinzler | 333/167 |
| 4,472,693 | 9/1984 | Uemura et al. | 333/167 |
| 4,611,185 | 9/1986 | Dirmeyer et al. | 333/167 |
| 4,620,165 | 10/1986 | Kinzler | 333/167 |
| 4,622,526 | 11/1986 | Schneider et al. | 333/185 X |

Primary Examiner—Eugene R. LaRoche
Assistant Examiner—Seung Ham
Attorney, Agent, or Firm—Ostrolenk, Faber, Gerb & Soffen

[57] ABSTRACT

The metal case has an opening, which includes a first portion for accommodating an inlet socket, and a second portion of a box-shaped form with a bottom for arranging filter components therein. On a rear side of the metal case, there is provided a printed circuit board which includes a first portion for mounting the inlet socket, and a second portion for mounting the filter components corresponding to the first portion and second portion of the metal case, respectively. An earth portion of the filter components contact the metal case, whereas the other portions of the filter components are mounted to the printed circuit board without contacting the metal case. On the printed circuit board, terminals protruding from the rear side thereof are provided. Surrounding the second portion of the metal case, there is installed a resin case with a bottom in which holes corresponding to the terminals are formed to lead out the terminals therethrough. The printed circuit board is contained in the resin case and fixed therein. On a peripheral edge of the metal case, metal tongues are formed so as to extend outwardly and, the metal tongues are secured directly to a chassis of an apparatus by means of screws.

7 Claims, 6 Drawing Sheets

NOISE FILTER WITH INLET SOCKET

BACKGROUND OF THE INVENTION

1. Field of the Invention

The present invention relates to a noise filter with an inlet socket. More specifically, the present invention relates to a noise filter with an inlet socket for removing high frequency noise components from a switching power supply and the like.

2. Description of the Prior Art

One example of a conventional noise filter with inlet socket is disclosed, for example, in Japanese Utility Model Laid Open No. 134820/1981 laid open on Oct. 13, 1981. In addition, mounting structures for such a conventional noise filter are generally shown in FIGS. 9A, 9B, 10A and 10B.

Figure 9A:
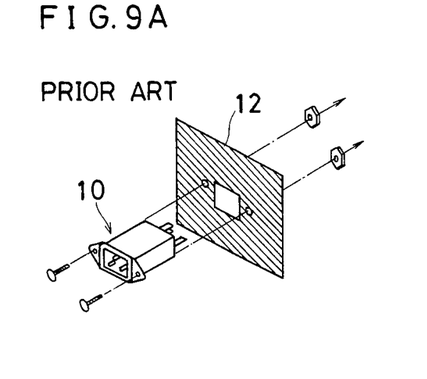
FIGS. 9A, 9B, 10A and 10B are schematic views respectively showing mounting constructions of a conventional noise filter with inlet socket forming the background of the present invention.
Figure 9B:
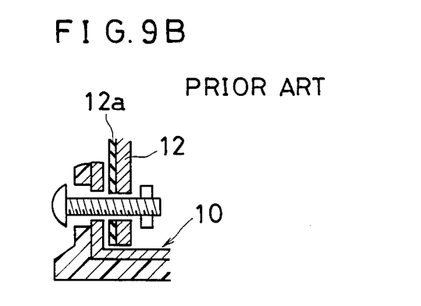
Figure 10A:
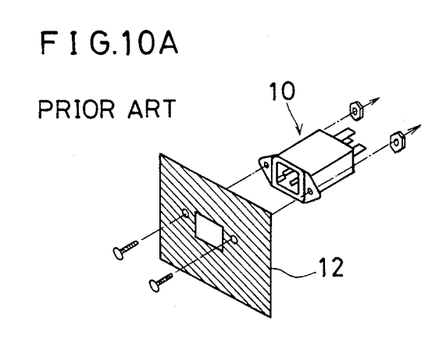
Figure 10B:
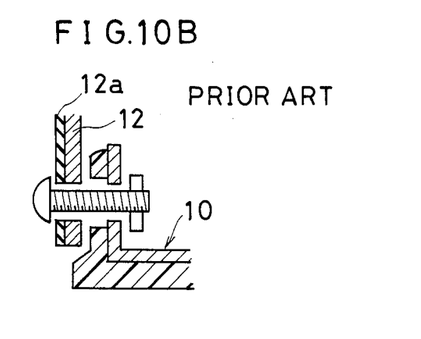

In the example shown in FIGS. 9A and 9B, the noise filter with inlet socket 10 is mounted from a front side of a chassis 12 of an apparatus. In the example of FIGS. 10A and 10B, the noise filter with inlet socket 10 is mounted from a rear side of a chassis 12 of an apparatus.

In general, bolts and nuts are used to secure the noise filter 10 onto the chassis 12. In such case the electric stability of the earth (ground) is deemed to be sufficient.

In either example of FIGS. 9A, 9B and 10A, 10B, however, when the chassis 12 is coated with paint, the ground connection becomes very unstable due to the coated layer 12a, and the earth portion which is to be connected to the ground potential is likely to isolated from the ground potential in the worst case.

In order to avoid such unstable grounding, an earth terminal is used and is connected to the ground potential with a lead wire, but in such case, the grounding will become unstable against high frequency noise components due to the unductance of the lead wire.

SUMMARY OF THE INVENTION

It is, therefore, a principal object of the present invention to provide a noise filter with inlet socket enabling a better stability of the grounding connection.

It is another object of the present invention to provide the noise filter with inlet socket which is easy to assemble.

In brief, the present invention is a noise filter with an inlet socket comprising, a filter element having an earth portion which is to be connected to the ground potential, a metal member to which the earth portion of the filter element is connected, and a metal tongue extending integrally from the metal member and screwed directly to a chassis of an apparatus.

In the present invention, the metal tongue extending integrally from the metal member is screwed to the chassis of an apparatus by means of screws or bolts and nuts, and thus the metal member (earth portion) is connected directly to the chassis.

According to the present invention, therefore, even if the chassis surface of the apparatus were coated with paint, since the metal member is connected directly through the metal tongue to the rear surface thereof, unstable connection caused by the paint coating is effectively avoided. Thus, according to the present invention, the noise filter with inlet socket having a more stable grounding connection as compared with the prior art may be obtained.

Conventionally, the noise filter with inlet socket was formed by wiring and soldering the prescribed filter components onto a printed circuit board, which is contained in a case and an earth pattern of the printed circuit board is soldered to the case. Accordingly, the prior art noise filter with inlet socket must be soldered at least twice, resulting in a complicated assembly.

In the embodiment in accordance with the present invention, the noise filter comprises, a metal member formed with a first portion for disposing an inlet socket and a second portion for arranging a filter component, and a printed circuit board having a first portion for mounting the inlet socket and a second portion for installing the filter components, corresponding respectively to the first portion and second portion of the metal member, an earth portion of the filter component being contacted with the metal member, whereas the other portions thereof are mounted to the printed circuit board without contacting with the metal member, and further comprises terminals protruding through the printed circuit board, a resin case with a bottom, holes formed on the bottom of the resin case correspondingly to the terminals, and means for containing the printed circuit board in the resin case and securing the both together.

According to this embodiment, the filter component is arranged on the second portion of the metal member and mounted on the printed circuit board in the manner that the earth portion of the filter component is contacted with the metal member while the other portion is not contacted with the metal member. The inlet socket is arranged on the first portion of the metal member and mounted on the corresponding first portion of the printed circuit board. All terminals or lead wires are protruding to the rear side of the printed circuit board. By soldering the printed circuit board at that stage, it is possible to electrically connect and mechanically secure the inlet socket, filter component and the terminal to the printed circuit board. Thereafter the printed circuit board is inserted into the resin case and fixed together.

According to the embodiment, therefore, since the terminals or leads of all components or elements can be connected to the printed circuit board by only one soldering process, the number of steps for assembling may be reduced as compared with the prior art, whereby the noise filter with inlet socket can be easily assembled.

These objects and other objects, features, aspects and advantages of the present invention will become more apparent from the following description of the embodiments of the present invention when taken in conjunction with accompanying drawings.

BRIEF DESCRIPTION OF THE DRAWINGS

FIGS. 7A and 7B are schematic views showing the noise filter with inlet filter mounted on a chassis of an apparatus, in which

DESCRIPTION OF THE PREFERRED EMBODIMENTS

Figure 1:
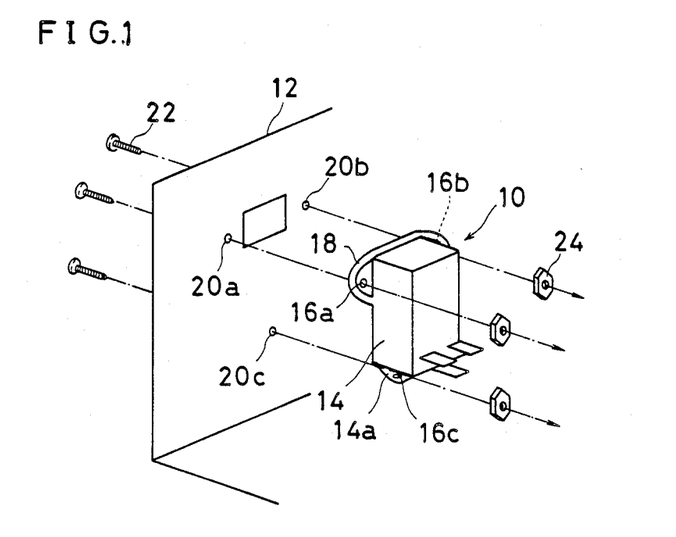
FIG. 1 is a first illustrative view showing an embodiment in accordance with the present invention.

FIG. 1 is a schematic perspective view showing a first embodiment of a noise filter having an inlet socket in accordance with the present invention. A noise filter 10 with an inlet socket 18 includes a metal case 14 to which an earth portion of filter elements, not shown, is connected therein. Under the metal case 14 and extending integrally therefrom, a tongue 14a is formed. On the upper portion of the noise filter 10 with inlet socket 18, a brim portion of the inlet socket 18 is exposed, and at the portion of the metal case 14 on the rear side of the brim portion, holes 16a and 16b are formed. A hole 16c is formed on the aforementioned tongue 14a.

A chassis 12 of an apparatus is formed with holes 20a, 20b and 20c, the noise filter 10 with inlet socket 18 being fixed to the chassis 12 by means of bolts 22 and nuts 24 through the holes 20a, 20b and 16a, 16b. Also, a bolt 22 and nut 24 are inserted through the hole 20c in the chassis 12 and the hole 16c in the metal tongue 14a, to secure the tongue 14a to the chassis 12. A mounted noise filter 10 is shown in FIG. 2.

Figure 2:
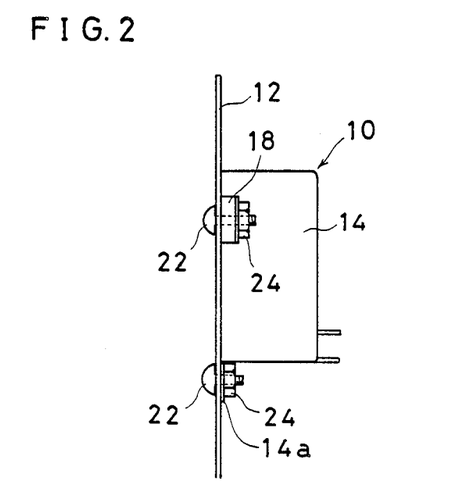
FIG. 2 is a side view showing a noise filter according to the embodiment of FIG. 1 mounted on a chassis.

As will be well understood from FIG. 2, in the first embodiment, a direct face contact takes place between the metal tongue 14a and the rear side of the chassis 12. The metal tongue 14a is formed by extending integrally from the metal case 14, and thus the metal case 14, and thereby the earth portion of the filter elements therein, is connected directly to the chassis 12. Therefore, even if the surface of the chassis 12 is coated with paint, a stable and reliable grounding connection may be attained as compared with the prior art.

Figure 3:
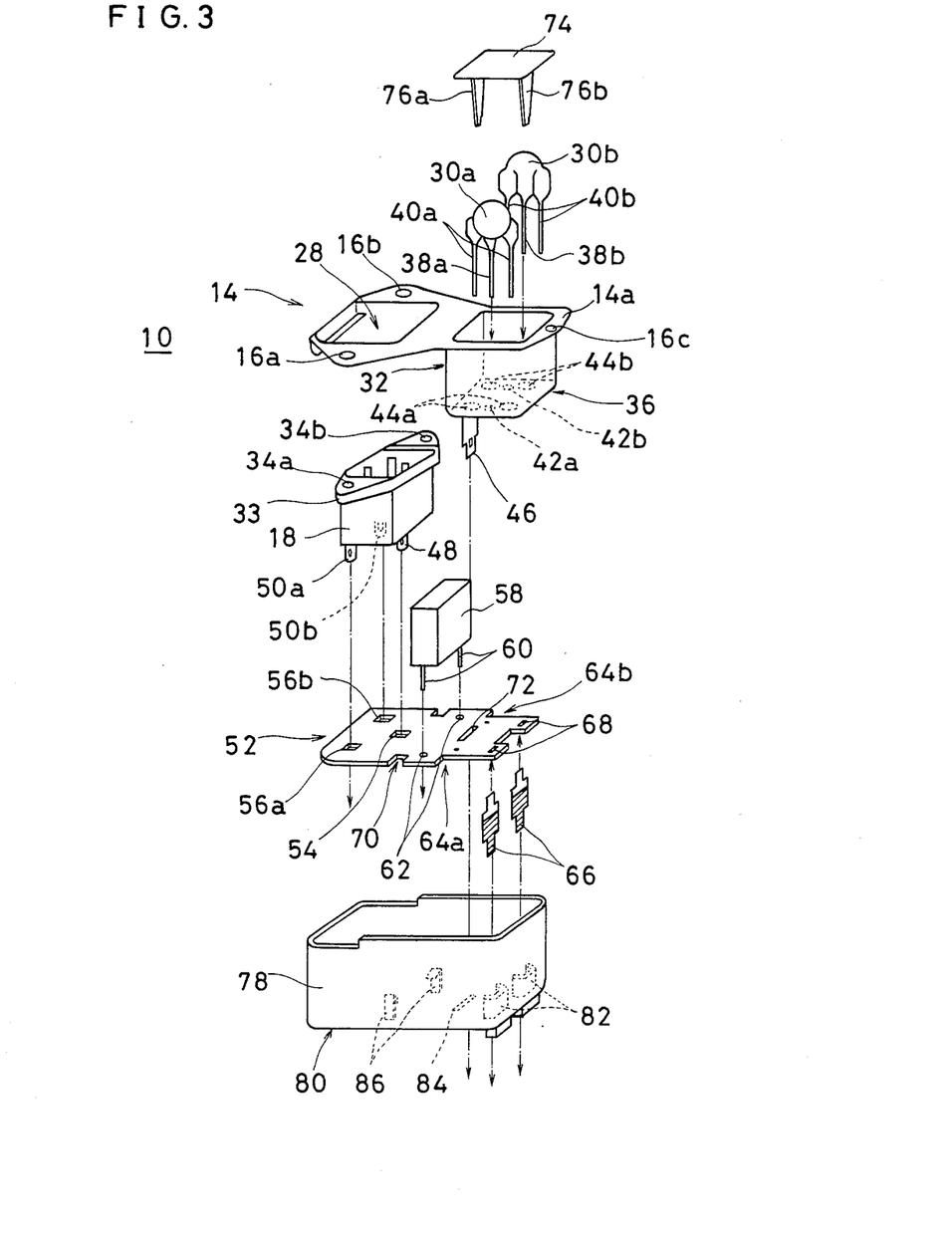
FIG. 3 is an exploded perspective view showing the first embodiment in accordance with the present invention.

FIG. 3 is an exploded perspective view showing details of the first embodiment in accordance with the present invention. The noise filter 10 with inlet socket 18 includes the metal case 14 formed from a metal plate such as aluminum by a press-working process. The metal case 14 includes an opening 28 for inserting the inlet socket 18 therethrough and a case portion 32 for containing three-terminal capacitors 30a and 30b as one example of the filter elements. The three-terminal capacitors 30a and 30b are formed with electrodes opposing on both surfaces of a dielectric unit, the earth lead is connected to the earth electrode and the input and output leads are connected to the opposing electrodes. A bead core may be used if necessary.

On both sides of the opening 28, holes 16a and 16b are formed so as to respectively correspond to the screw holes 34a and 34b provided on a brim portion 33 of the inlet socket 18. The case portion 32 is formed in a box shape with a bottom, having an upper opening and a bottom plate 36. In the vicinity of the upper end opening of the case portion 32, there is formed the tongue 14a provided with the hole 16c.

On the bottom plate 36, corresponding respectively to an earth lead 38a and remaining two leads 40a of one three-terminal capacitor 30a, an earth lead hole 42a and two holes 44a on both sides of the same are formed. Similarly, an earth lead hole 42b and holes 44b are formed corresponding respectively to an earth lead 38b and remaining leads 40b of the other three-terminal capacitor 30b.

On the bottom plate 36 of the case portion 32 of the metal case 14, a terminal 46 protruding downwardly is secured, for example, by spot welding.

The inlet socket 18 is formed in a rectangular shape from an insulating material such as a synthetic resin, and secured with one earth terminal 48, an input terminal 50a and an output terminal 50b on the bottom thereof.

There is provided a printed circuit board 52, whose rear side is printed with a necessary conductive pattern. On the printed circuit board 52, mounting holes 54, 56a and 56b are formed so as to correspond respectively with the earth terminal 48, and input and output terminals 50a and 50b, of the aformentioned inlet socket 18.

On the printed circuit board 52, there is also provided mounting holes 62 for a pair of leads 60 of a film capacitor 58 generally in the center along the longitudinal direction of the board 52.

At one end on both lateral sides of the printed circuit board 52, step portions 64a and 64b are formed, which respectively serve as a "clearance" for the earth leads 38a and 38b of the three-terminal capacitors 30a and 30b.

On the printed circuit board 52, further mounting holes 68 are formed for the two tab terminals 66, which are press-inserted into the mounting holes 68. The tip portions of the terminals 66 are covered, for example, with rubber caps as shown by the oblique lines, whereby solder is prevented from being attached to those portions in the following soldering process.

On both lateral sides generally in the center in the longitudinal direction, of the printed circuit board 52, notches 70 are formed. A hole 72 for the terminal 46 previously described is formed in the printed circuit board 52.

For covering the upper opening of the case portion 32 of the metal case 14, there is provided a resin cover 74, whose under surface is formed with two legs 76a and 76b, which are welded to the printed circuit board 52 at their tips through the holes or notches (not shown) formed in the bottom plate 36 of the metal case 14.

There is provided an elongate rectangular resin case 78 with a bottom. The resin case 78 is made of an insulating material such as a synthetic resin. On a bottom plate 80 of the case 78 are terminal guides 82 for the aforementioned terminals 66 as well as a hole 84 for the terminal 46 extending through the printed circuit board 52. Further on the bottom plate 80 of the resin case 78, fixing claws 86 are formed at the positions corresponding to the notches 70 on both lateral sides of the printed circuit board 52.

In assembly, first the inlet socket 18 and the film capacitor 58 are mounted to the printed circuit board 52. More specifically, the earth terminal 48 and the input and output terminals 50a and 50b of the inlet socket 18 are inserted respectively into the mounting holes 54, 56a and 56b of the printed circuit board 52. At the same time, the leads 60 of the film capacitor 58 are inserted into the mounting holes 62.

Thereafter, the metal case 14 is arranged on the upper surface of the printed circuit board 52 so that the terminal 46 is extended through the hole 72.

Then, the three-terminal capacitors 30a and 30b are mounted to the case portion 32 of the metal case 14.

More specifically, the earth lead 38a of the three-terminal capacitor 30a is inserted into the earth lead holes 42a of the metal case 14, and the other leads 40a are inserted into the mounting holes (not shown) of the printed circuit board 52 through the holes 44a in the case portion 32. Similarly, the earth lead 38b of the three-terminal capacitor 30b is inserted into the earth lead hole 42b, and the other leads 40b are inserted into the mounting holes (not shown) of the printed circuit board 52 through the holes 44b.

Figure 4:
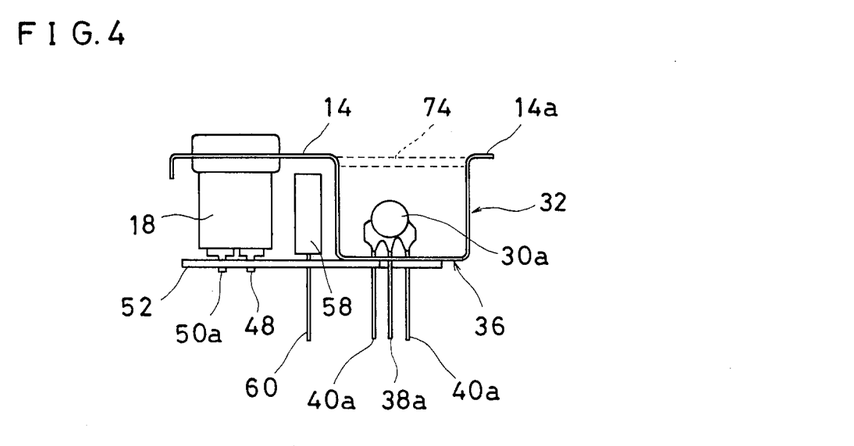
FIG. 4 is a sectional schematic view showing the components assembled and soldered to a printed circuit board in the embodiment of FIG. 3.

Next, the terminals 66 are press-inserted into the mounting holes 68 of the printed circuit board 52. The assembled state is shown in FIG. 4. However, in FIG. 4 and the following FIG. 5, the terminal 46 and the terminals 66 and so on are omitted in order to simplify the figures.

In the assembled state as shown in FIG. 4, the lower surface of the printed circuit board 52 is soldered, for example, with flow soldering. In this step, the terminals 48, 50a and 50b of the inlet socket 18 are electrically connected and mechanically secured to the printed circuit board 52, and at the same time, the leads 60 of the film capacitor 58 are similarly connected thereto. The earth leads 38a and 38b of the three-terminal capacitors 30a and 30b are in contact with the earth-lead holes 42a and 42b (FIG. 3) in the bottom plate 36 of the case portion 32 of the metal case 14, and are positioned at the step portions 64a and 64b (FIG. 3) of the printed circuit board 52. This means that, in this state, the earth leads 38a and 38b are connected to the metal case 14. The other leads 40a and 40b are extended respectively through the holes 44a and 44b in the bottom plate 36 of the case portion 32 of the metal case 14, and inserted into the corresponding mounting holes (not shown) of the printed circuit board 52 for connection.

Figure 5:
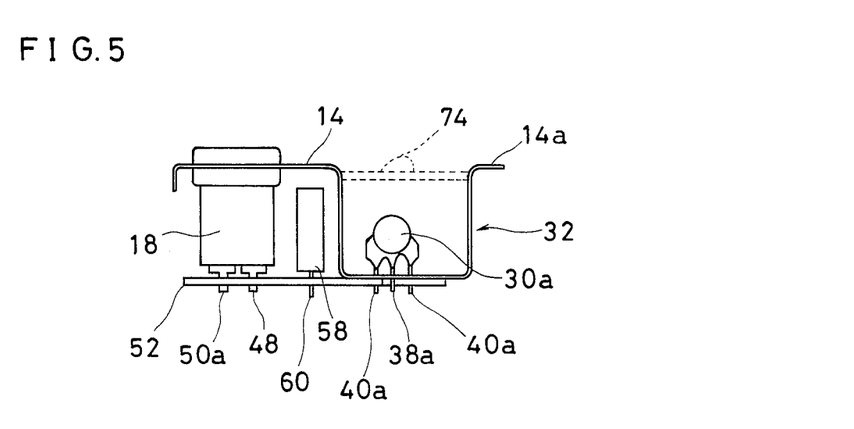
FIG. 5 is a sectional schematic view similar to FIG. 3, in which unnecessary leads are cut off.

Thereafter, the unnecessary portions of leads are cut as is shown in FIG. 5. Although not shown, the rubber caps covering the terminals 66 previously described may be removed at this stage.

At this time, if necessary, the resin cover 74 may be mounted.

As shown in FIG. 5, the printed circuit board 52 mounted with respective necessary components is then mounted in the resin case 78. At this time, the terminals 66 and 46 are protruded from the resin case 78 respectively through the terminal guides 82 and the hole 84 in the resin case 78. In this mounted state, the printed circuit board 52 is held by the fixing claws 86 at the two notches described above, and thereby secured within the resin case 78.

Figure 6:
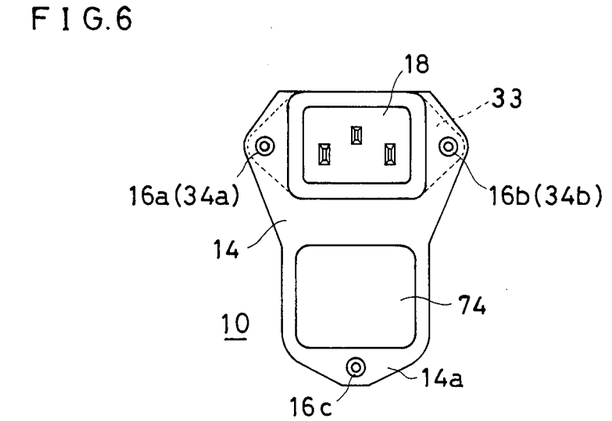
FIG. 6 is a front view showing a completed noise filter with inlet socket according to the first embodiment.

In such a manner, as shown in FIG. 6, the noise filter 10 with inlet socket is completed.

Figure 7A:
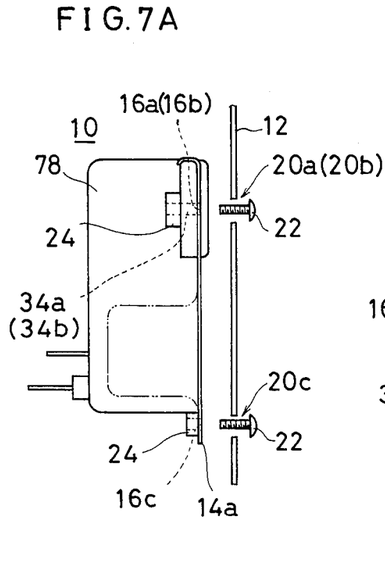
FIG. 7A is a side view and FIG. 7B is a top plan view.
Figure 7B:
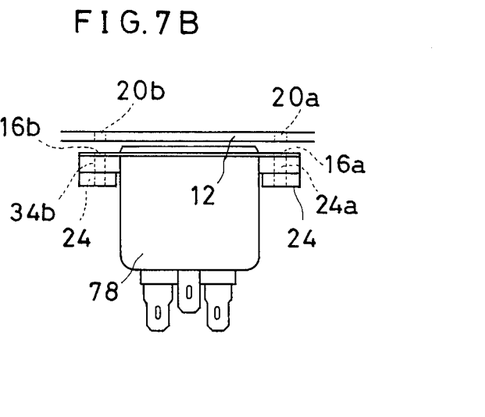

Such noise filter with inlet socket is then mounted to the chassis 12 of the apparatus in a manner shown in FIGS. 7A and 7B. More specifically, on the chassis 12, holes 20a and 20b are formed respectively corresponding to the holes 16a and 16b in the metal case 14, or the screw holes 34a and 34b in the inlet socket 18, further the hole 20c corresponding to the hole 16c in the tongue 14a of the metal case 14 is formed. Screws 22 are inserted through the holes 20a(20b) and 16a(16b) and the screw holes 34a(34b) and fixed with the nuts 24. At the same time, the screw 22 is inserted into the hole 20c in the chassis 12 and the hole 16c in the tongue 14a of the metal case 14 and tightened with the nut 24 from the rear side of the tongue 14a.

As it will be clearly understood from FIGS. 7A and 7B, when the noise filter with inlet socket is mounted to the chassis 12 in such a manner, the tongue 14a of the metal case 14 is brought into direct face-contact with the rear side of the chassis 12. Thus, the grounding of the noise filter 10 is improved.

Alternatively, the resin cover 74 shown in the embodiment of FIG. 3 as well as the side walls of the case portion 32 of the metal case 14 may be deleted.

In the embodiment described above, the noise filter with inlet socket was fixed to the chassis 12 by means of screws and nuts. However, this may be alternatively effected by tapping screws. More specifically, the tapping screws may be screwed into the thick resin case of the inlet socket 18 at the portions of holes 16a(16b). In this case, for the portion of hole 16c of the tongue 14a, since the resin case does not exist in the embodiment shown, if the tapping screw were to be used, a portion of thick resin case must be formed in that portion.

Figure 8:
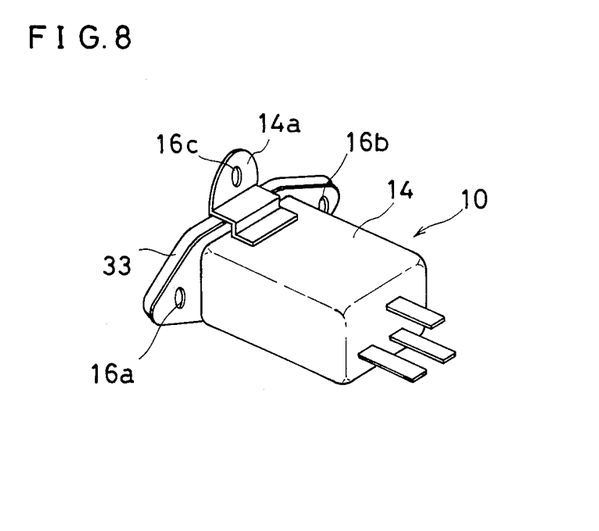
FIG. 8 is a perspective view showing a second embodiment in accordance with the present invention.

FIG. 8 is a perspective view showing another embodiment in accordance with the present invention. In this embodiment, a tongue 14a is protruded upwardly from the brim portion 33 of the inlet socket 18 from the upper portion of the metal case 14. A hole 16c is formed in the tongue 14a in the same way as in the embodiment of FIG. 1. Also, in the embodiment of FIG. 8, the tongue 14a is fixed to the rear side of the chassis 12 in a direct face-contact, when it is mounted to the chassis of the apparatus.

In the above embodiments, terminals are arranged to protrude from the rear side of the metal case 14. Although not shown in the drawings, these terminals are led out from the metal case so as to be insulated from the metal case by means of insulation members.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A noise filter which has an inlet socket and is directly groundable to a chassis, comprising:
    an inlet socket;
    a filter element having an earth portion to be grounded and a signal-carrying portion not to be grounded;
    a metal member having a first portion for accommodating said inlet socket and a second portion for accommodating said filter element, said second portion being formed as a case having a bottom plate to which said earth portion of said filter element is connected, and through which said signal-carrying portion of said filter element is passed without contacting said bottom plate; and
    a printed circuit board for interconnecting said filter element and said inlet socket, having a first portion corresponding to said first portion of said metal member and for being electrically connected and mounted to said inlet socket, and a second portion corresponding to said second portion of said metal member and for being mounted to said filter element, said signal-carrying portion of said filter element being connected to said second portion of said printed circuit board.

2. A noise filter with inlet socket in accordance with claim 1, further comprising:
    a resin case having a bottom plate;
    a throughhole formed in said bottom plate of said resin case;

a terminal mounted on a side of said printed circuit board away from said filter element and inlet socket so as to extend downward away from said printed circuit board; and means for securing said resin case and said printed circuit board contained therein with said terminal protruding through siad throughhole of said resin case.

3. A noise filter with inlet socket as in claim 1, further comprising grounding means for grounding said metal member and thereby grounding said earth portion of said filter element to a chassis, said grounding means including means integral with said metal member for being mounted in direct conductive contact with said chassis.

4. A noise filter with inlet socket as in claim 3, wherein said means integral with said metal member includes a flange adjacent to said inlet socket having a conductive face directed toward said chassis when said inlet socket is mounted to said chassis.

5. A noise filter which has an inlet socket and is directly groundable to a chassis, comprising;

a printed circuit board having throughhole means formed therein;

an inlet socket mounted on said printed circuit board, said inlet socket having terminal means which is connected to said printed circuit board through the throughhole means, and having a body portion which as a flat surface at the upper surface thereof which is formed at the periphery of an insertion opening of said inlet socket;

a metal member having a flat frame portion positioned above said flat surface of said body portion of said inlet socket, and a casing portion having a bottom plate in which throughhole means are formed, said frame portion being contacted with said flat portion of said inlet socket at the rear surface of said frame portion, and said bottom plate of said casing portion being mounted on said printed circuit board; and a filter element having an earth portion to be grounded and a signal-carrying portion, said earth portion of said filter element being connected to said casing portion of inserted through the throughhole means of said bottom plate of said casing portion without contacting said bottom plate, and connected to said printed circuit board.

6. A noise filter with inlet socket in accordance with claim 5, further comprising:

a resin case having a bottom plate;

a throughhole formed in said bottom plate of said resin case;

a terminal mounted on a side of said printed circuit board away from said filter element and inlet socket so as to extend downward away from said printed circuit board; and means for securing said resin case and said printed circuit board contained therein with said terminal protruding through said throughhole of said resin case.

7. A noise filter with inlet socket in accordance with claim 5, wherein said metal member has a flange portion with throughholes for fixing said noise filter to a chassis, and said flat portion of said inlet socket and said frame portion of said metal member are configured and disposed for being simultaneously fastened to a chassis with a screw for fixing said noise filter with inlet to the chassis and thereby directly grounding said earth portion of said filter element.

* * * * *